United States Patent [19]

Jones

[11] Patent Number: 4,507,544
[45] Date of Patent: Mar. 26, 1985

[54] BURN-IN CLOCK MONITOR
[75] Inventor: Daniel P. Jones, Houston, Tex.
[73] Assignee: Reliability, Inc., Houston, Tex.
[21] Appl. No.: 426,767
[22] Filed: Sep. 29, 1982
[51] Int. Cl.³ .............................................. H05B 1/00
[52] U.S. Cl. .................................... 219/209; 219/385
[58] Field of Search .................. 219/201, 209, 385; 174/59, 67, 151; 361/382–384; 324/158 F, 158 D, 158 R; 340/514–516

[56] References Cited

U.S. PATENT DOCUMENTS

| 2,978,641 | 4/1961 | Voegtlen | 324/158 R |
| 3,643,247 | 2/1972 | Ratcliffe | 340/517 |
| 3,679,970 | 7/1972 | Winters | 324/158 D |
| 4,374,317 | 2/1983 | Bradshaw | 219/385 |

OTHER PUBLICATIONS

Reliability, Inc., "Criteria IV Burn-In System".

Primary Examiner—Roy N. Envall, Jr.
Assistant Examiner—Teresa J. Walberg
Attorney, Agent, or Firm—Murray Robinson; David S. Wise

[57] ABSTRACT

The several clock lines on a burn-in board are monitored by diode ANDing the clock lines to one or two monitor lines, the ANDing circuitry being mounted on the burn-in board and each monitor line being connected through the burn-in chamber back wall to a detection circuit for detecting presence, level, and/or other quality of the signal on the monitor line and giving an indication and sounding an alarm when the desired monitor signal quality is absent.

10 Claims, 19 Drawing Figures

BURN-IN CLOCK MONITOR

CROSS REFERENCE TO RELATED APPLICATIONS

This application discloses improvements to the burn-in apparatus (Cf FIGS. 1–10 hereof) disclosed in United States patent application Ser. No. 055,058 filed July 5, 1979 by James I. Bradshaw entitled "Burn-In Chamber" now U.S. Pat. No. 4,374,317 to which application reference may be made for further details and a discussion of some of the prior art. See also allowed U.S. patent Ser. No. 165,969 now U.S. Pat. No. 4,351,108 filed July 7, 1980, by James E. Johnson entitled "Packaging System for Semi-Conductor Burn-In." Both of these applications are assigned to the same assignee as the present application.

BACKGROUND OF THE INVENTION

This invention pertains to a burn-in apparatus for isolating faulty semiconductor chips and more particularly to an improvement thereof for ensuring proper operation of the burn-in apparatus. More specifically, the invention relates to monitoring electrical signals which exercise the semiconductor chips to verify that clock-driver circuits generating the electrical signals and electrical connections between the clock-driver circuits and the semiconductor chips are functioning correctly.

Burn-in apparatus is known in which the DIPs (dual in-line packages) or the DUTs (devices under test) are placed in PC (printed circuit) boards, called burn-in boards (BIBs), that are then plugged into the front side of a mother board in a panel (back plane) forming the back part of the hollow back wall of an oven (burn-in chamber) where controlled temperature is maintained. A plurality of clock boards, each clock board to be connected to, e.g., a plurality of burn-in boards, are plugged into the back side of the mother board at the back of the panel, it being desirable to have the clock boards as close to the burn-in boards as possible to reduce electrical interference and signal degredation.

Heretofore, the clock-driver signals have been monitored by comparing the output signals of each driver output line with its input line from the clock. This procedure adequately protects against clock-driver circuit failure but does not detect a failed electrical connection between the clock-driver circuit and the burn-in boards. In order to detect failure in the electrical connections, e.g., including card-edge connectors or other quick connectable and disconnectable connectors, between several burn-in boards and the back side of the mother board in the back plane, as well as connectors at the front side thereof which connect the clock boards to the mother board, it is necessary that the clock-driver signals be monitored on each burn-in board, and all these monitor lines must then be connected back through the back panel via further quick connectable and disconnectable connectors to the monitoring detector apparatus outside the burn-in chamber. The additional connections and detector apparatus necessary to accomplish such burn-in board monitoring renders the procedure prohibitively expensive. Hence, the present apparatus and method for exercising semiconductor chips does not provide a reasonable means for assuring that all semiconductor chips are indeed being exercised.

SUMMARY OF THE INVENTION

Accordingly, two diode gate circuits (i.e., positive and negative logic AND gates, which is the same as negative and positive logic OR gates or one AND gate or one OR gate of like logic) are connected to the clock-driver lines on each burn-in board.

The input of each gate is connected to each of the several clock-driver lines on a burn-in board, and the output or monitor line is connected via quick connectable and disconnectable connectors at the front side of the mother board to a monitor board also connected via quick connectable and disconnectable connectors to the mother board at the back side of the back panel. Thus, the number of monitor lines going through the back panel is reduced from one line per clock-driver line (which may number in the tens, e.g., 22) per burn-in board, to just one line per gate, which, with one or two gates per board, amounts to no more than two lines per burn-in board.

The clocks are programmed, either inherently or intentionally, to all assume simultaneously a like high, and/or also to a like low once each exercise cycle. At such times, signals are sent to a detector which determines if the signal, e.g., the voltage presence or level or other quality, is correct; if not, it is presumed that a clock or conection has failed.

Provision may be made for temperature compensation of the gate circuits and for monitor signals of sufficient duration to eliminate the effect of transients such as overshoot and crosstalk or ringing. Semiconductor gates are preferred over vacuum tubes, which are expensive and bulky; diode gates are preferred over transistors, which are more likely to fail.

Summarizing, according to the invention, the number of monitor lines from each burn-in board, the number of front side and back side connectors on the mother board, and the number of detector circuits is reduced at least by a factor of ten.

BRIEF DESCRIPTION OF THE DRAWINGS

For a detailed description of preferred embodiment of the invention, reference will be made to the accompanying drawings wherein.

DETAILED DESCRIPTION OF PREFERRED EMBODIMENTS

Burn-In System Generally

According to present practices, semiconductors are massproduced and installed in electrical circuits within highly sophisticated, complex and costly equipment. As with many massproduced products, semiconductors are prone to failure, in many cases within the first thousand hours of operation. The complexity of the equipment within which such semiconductors are installed makes such post-installation failures highly undesirable. For example, when equipment reaches the final inspection stage of production before semiconductor failures are detected, the high level skills required for testing and repair add a significant cost to production expenses. Even more significantly, when the product is in the field and a service technician must make warranty repairs, the costs incurred can have a marked effect on profitability. As a result, manufacturers of electronic equipment are demanding ever greater quality and dependability in commercial grade semiconductors.

Such quality and dependability is enhanced substantially by detection of those semiconductors likely to fail in the first few hours of operation, prior to installation of such semiconductors in electronic equipment. One of the most effective methods of making such a detection is referred to as "burn-in." According to burn-in techniques, semiconductors are stressed within their physical and electrical limits prior to installation, whereby those semiconductors likely to become early failures in completed equipment can be discovered.

Burn-in involves placing a large number of semiconductors on one or more printed circuit boards ("burn-in boards"); placing such burn-in boards with the semiconductors mounted thereon in a chamber whose environment, particularly temperature, is controllable; applying dc biases to each semiconductor on each board in such a manner as to reverse, and sometimes forward, bias as many of such semiconductor's junctions as possible, and/or actively clocking each semiconductor to maximum rated conditions, such application of dc biases, clock signals and loads being accomplished substantially simultaneously to each semiconductor; removing the component boards from the chamber after the semiconductors have been subjected to the environmental condition of the chamber and the biases, clock signals and loads for a designated period of time; and removing the semiconductors from the burn-in boards.

The semiconductors can then be electrically tested by applying a room temperature test of critical dc parameters, e.g., input currents and thresholds, output voltages and currents, and, in the case of digital components, by making a functional test to verify truth table performance. In this way, the semiconductors that fail during burn-in are detected and segregated from those that do not fail. Because the semiconductors that do not fail during the burn-in process have withstood substantial stress, such semiconductors possess a high degree of dependability and can be installed in highly complex equipment with confidence that such semiconductors will not fail prematurely.

During burn-in, it is ordinarily desirable to maintain the environment within the burn-in chamber at an extremely high temperature, often about 150° C., and to maintain the temperature gradient throughout the burn-in chamber at approximately zero. In view of such high temperatures, the chamber is usually saturated with an inert gas, such as $N_2$, in order to minimize I.C. lead tarnish.

Furthermore, because such high temperatures tend to damage and/or to shorten the life of power supplies and circuit components ("clocking components") used in applying dc biases, clock signals and/or loads to the semiconductors being subjected to burn-in, such power supplies and clocking components ordinarily are positioned outside the chamber, e.g., on clock boards.

According to the present invention, each burn-in board is provided with AND gate means whose inputs connect to the lines from the clock board feeding the burn-in board and whose output lines are fed back to a monitor board outside the burn-in chamber.

Referring to FIGS. 1-4, a burn-in apparatus 20 comprises a welded steel frame partially enclosed by steel panels and includes instrumentation and power supply housing 12, burn-in chamber 10, and clock and monitor board rear cabinet 34.

Burn-In Chamber

Chamber 11 is generally enclosed on six sides by wall 13. Wall 13 is preferably made of one-inch thick marinite insulation material. The front portion of wall 13 has access openings 15, 17. Access openings 15, 17 are covered by doors 19, 21, respectively, such that when doors 19, 21 are closed, chamber 11 is substantially thermally insulated from the ambience outside the chamber.

Chamber 11 is divided into left and right sections 46, 48, respectively, by mid-chamber wall 50 extending substantially vertically therethrough. Wall 50 extends through the entire depth of chamber 11 with the top of wall 50 spaced below the top of chamber 11 so as to form upper duct 58 and the bottom of wall 50 spaced above the bottom of chamber 11 so as to form lower duct 56.

Chamber 11 further includes heater 24 for heating the interior of chamber 11 and air mover 26 for circulating air through chamber 11 so as to maintain a narrow temperature gradient even in a loaded chamber, i.e., a chamber fully loaded with components undergoing burn-in.

Connection Device Assemblies

Chamber 10 further includes connection device assemblies 27, 29, 31 attached to and extending through rear portion 33 of chamber wall 13. Assemblies 27, 29, 31 (1) retain burn-in boards in a fixed position within chamber 11 such that they are spaced from one another and from chamber wall 13 and mid-chamber wall 11 and such that air will flow between them; (2) retain one or more clock boards and monitor boards in a fixed position in rear portion 34 behind and outside chamber 11; and (3) provide connection apparatus for electrically interconnecting the burn-in boards, the clock boards, the monitor boards and the power supplies, the power supplies being part of instrumentation and power supply portion 12 as described hereinafter. Assemblies 27, 29, 31 are identical to one another and are vertically spaced from one another over the lower approximately two-thirds of chamber 11.

Figure 1:
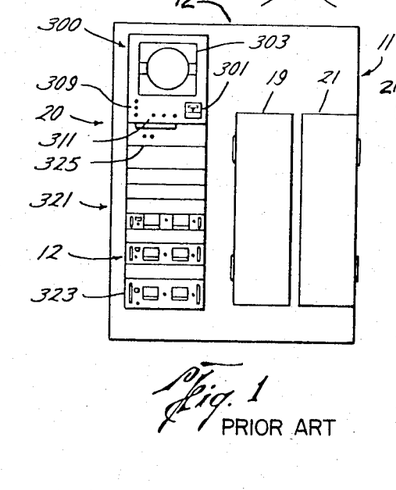
FIGS. 1–3 are front, side, and top views of a burn-in apparatus according to the aforementioned Bradshaw application, modified in accordance with the present invention.
Figure 2:
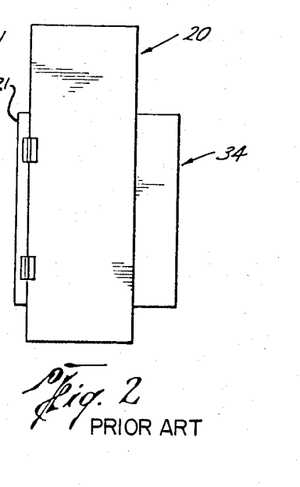
Figure 3:
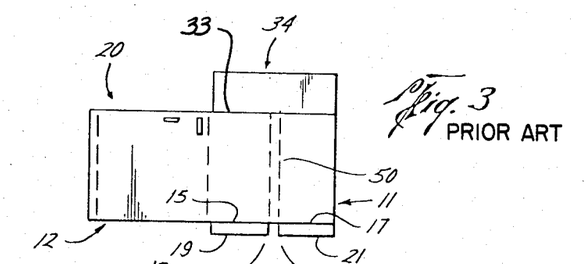
Figure 4:
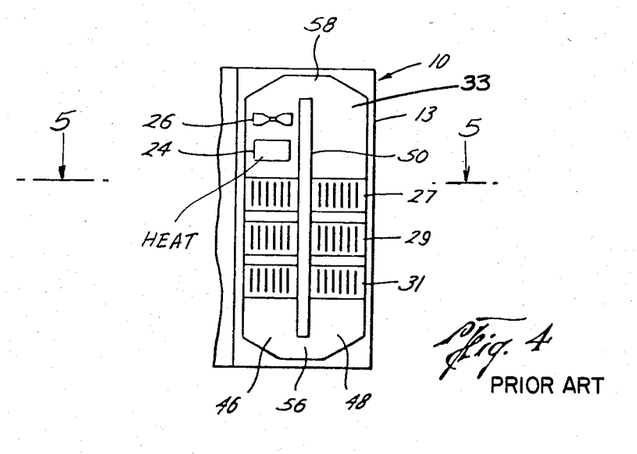
FIG. 4 is a fragmentary front view of the burn-in chamber of the burn-in apparatus shown in FIG. 1 but with the chamber doors removed.
Figures 5, 7, 9:
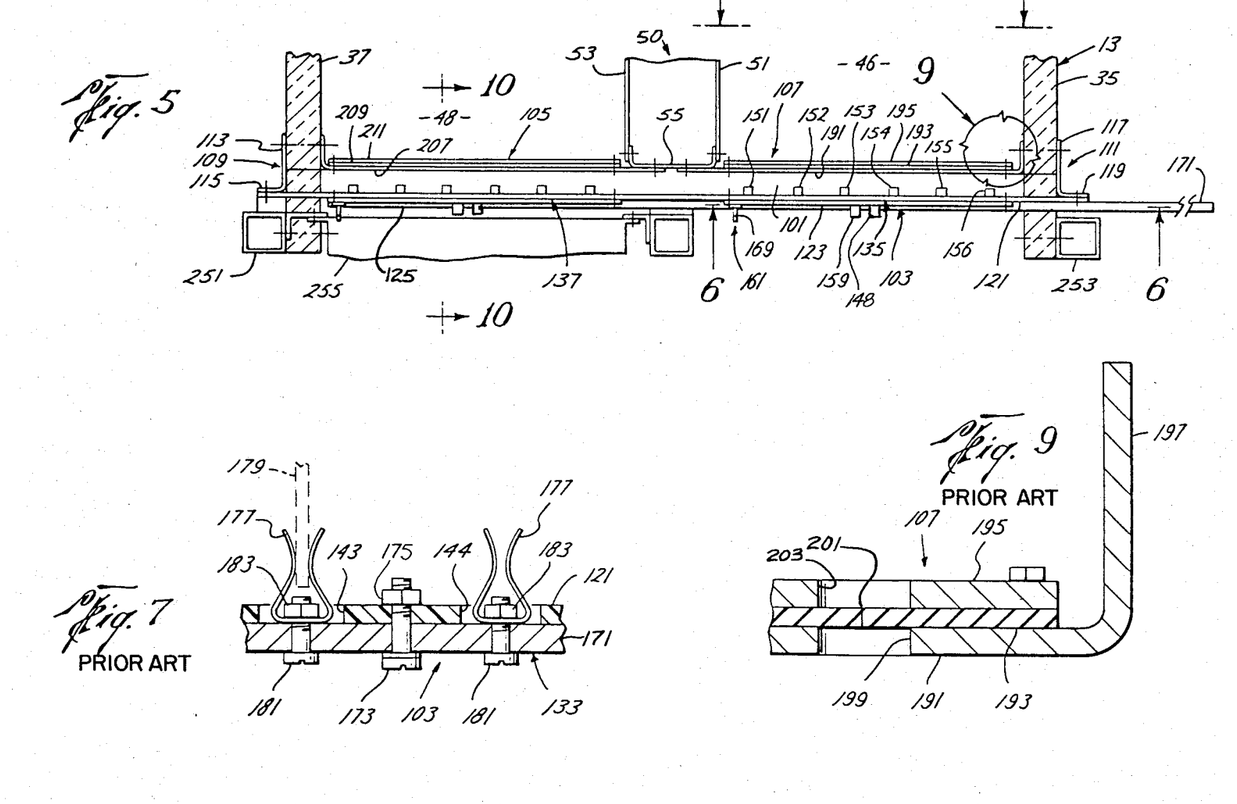
FIG. 5 is a horizontal section taken at plane 5—5 of FIG. 4.
FIG. 7 is a fragmentary enlarged horizontal section taken at plane 7—7 indicated on FIG. 6.
FIG. 9 is an enlarged fragmentary horizontal sectional view of the part of the apparatus circled in FIG. 5.

Referring to FIG. 5, each connection device assembly includes cavity 101 extending through rear portion 33 of chamber wall 13 across the entire horizontal width of such portion 33. Cavity 101 is bounded on the rear by cavity cover assemblies 105, 107, and mid-chamber wall 50, and on the sides by side walls 35, 37.

Figure 6:
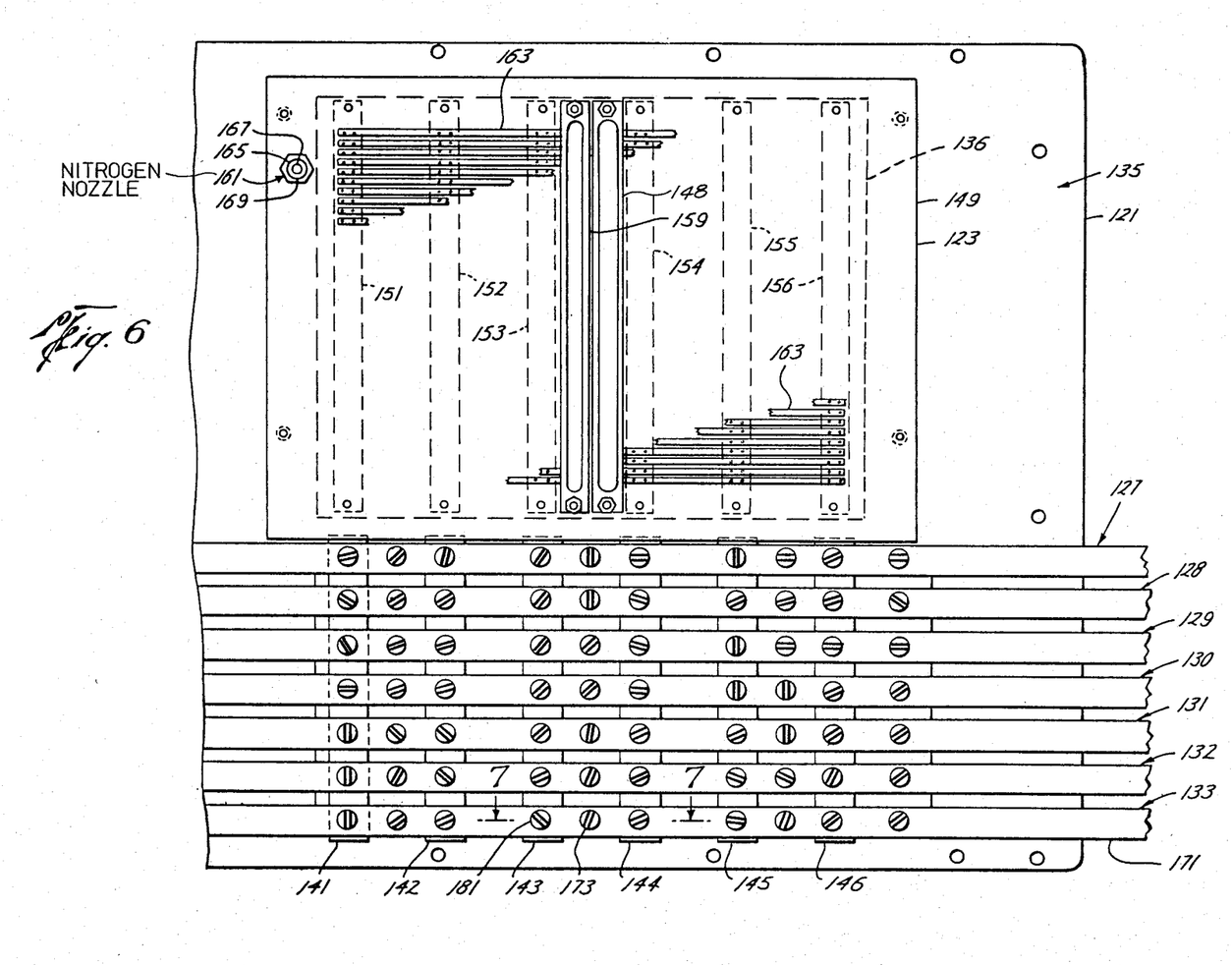
FIG. 6 is a rear elevational view taken of plane 6—6 indicated on FIG. 5.
Figure 8:
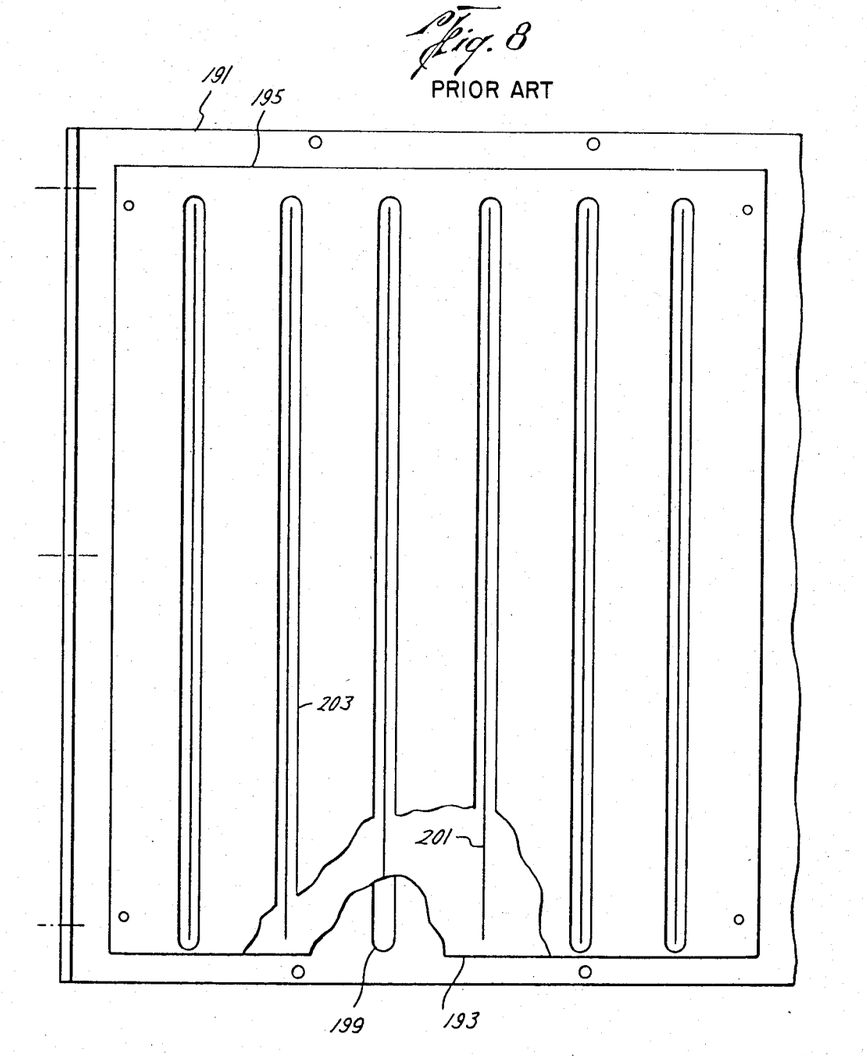
FIG. 8 is an interior fragmentary enlarged front elevation taken at plane 8—8 indicated on FIG. 5.

Cavity base assembly 103 includes back plane 121, mother board units 123, 125 and bus bar units 127–133 (FIG. 6). Back plane 121 covers the entire rear portion of cavity 101 and is attached to brackets 109, 111 on the sides and to the exterior surface of rear portion 33 of chamber wall 13 along the top and bottom.

Referring to FIGS. 6 through 10, rectangular connector access openings 136 extend through the upper approximately one-half of back plane 121 at each side of mid-wall 55 and vertically elongate, power clip access openings 141–146 extend through back plane 121 below connector access opening 136.

Mother Boards

Each of mother boards 123, 125 is a board made of a rigid, heat resistant material such as fiberglass, attached to back plane 121 so as to generally cover connector access opening 136. Each mother board has mounted thereon monitor board connector 148, burn-in board connectors 151–156, clock board connection 159 and nitrogen nozzle 161.

Burn-in Board Connectors

Preferably, burn-in board connectors 151–156 are printed circuit edge connectors identical to one another and mounted such that the burn-in board mating portion faces toward the front, but not through, cavity 101, and the connection lugs or terminals extend through the mother board so as to be slightly exposed at the rear surface thereof. Burn-in board connectors 151–156 are oriented vertically and are aligned with power clip access openings 141–146, respectively, of back plane 121. The burn-in board connectors are oriented with respect to one another such that the corresponding terminals of such connectors are arranged along a substantially horizontal line. Each mother board further includes substantially horizontal printed circuit strips 163 etched onto the rear surface thereof for interconnecting the corresponding terminals of each of the burn-in board connectors 151–156, i.e., in accordance with conventional terminal assignment for printed circuit edge connectors, for connecting all the A terminals of burn-in board connectors 151–156 together, for connecting all the B terminals of connectors 151–156 together, etc. For proper electrical connection, the portion of the terminals or lugs of connectors 151–156 exposed at the rear surface of the mother board are soldered to the corresponding printed circuit strip.

Monitor Board and Clock Board Connectors

Monitor board connector 148 and clock board connector 159 are printed circuit edge connectors identical to connectors 151–156 and mounted on mother board 123 such that the monitor or clock board mating portion faces away from the rear surface of the mother board, i.e., away from chamber 11, and such that the connection lugs or terminals of connectors 148 and 159 extend at least partially through the mother board. Monitor and clock board connectors 148 and 159 are oriented vertically and are positioned between burn-in board connectors 153–154 such that the terminals or lugs of connectors 148 and 159 can be electrically connected to printed circuit strips 163, so that terminal A of clock board connector 159 is connected to the strip corresponding to terminal A of burn-in board connectors 151–156, terminal B of clock board connector 159 is connected to the strip corresponding to terminal B of burn-in board connectors 151–156, etc., and so that terminals X and Y of monitor board connector 148 are connected to the corresponding terminals X and Y of burn-in board connectors 151–156.

Nitrogen Supply

Nitrogen nozzle 161 provides a means for supplying nitrogen to cavity 101 and includes body 165 havng passage 167 therethrough and tube connecting portion 169 adapted to receive and hold securely a piece of flexible tubing. Tube connecting portion 169 extends from the rear surface of board 149. Body 165 extends through board 149 such that when a nitrogen supply tube is attached to portion 169, nitrogen will flow through passage 167 and into cavity 101.

Bus Bars

Each of bus bar units 127–133 includes an elongate bar 171 made of an electrically-conductive material and extending substantially horizontally from a point between the edge of back plane 121 adjacent right portion of chamber wall 13 and the power clip access opening closest to such edge, across back plane 121 and into instrumentation and power supply portion 12 of chamber 11. Bars 171 of bus bars units 127–133 are vertically spaced from one another with each bar 171 passing over each power clip acess opening of back plane 121. Each bar 171 is fastened to back plane 121 by a plurality of machine screws 173, extending through passages in such bar and back plane 121 and secured therein by nut 175, as best seen in FIG. 7.

Each of bus bar units 127–133 further includes a plurality of clips 177 attached to bar 171 of such bus bar unit and extending through a power clip access opening and into cavity 101, there being one clip 177 for each such opening over which such bar 171 passes. Clips 177 are designed to receive a printed circuit board, such as burn-in board 179 shown in FIG. 7, such that clip 177 will make an electrical connection with printed circuit lands on either surface of such board. Each clip 177 is electrically connected to a bar 171 by a screw and nut, 181, 183, respectively. Each clip 177 should be oriented such that a printed circuit burn-in board can be received simultaneously by such clip and the burn-in board connector positioned directly above the power clip access opening through which such clip extends. For each bar 171, there is a corresponding clip 177 extending into cavity 101 directly below each burn-in board connector. Thus, a burn-in board printed circuit received by any one of the burn-in board connectors can simultaneously be electrically connected to each of bars 171.

Gaskets

Referring to FIG. 5, each of cavity cover assemblies 105, 107 includes a rear panel 191, gasket 193 and holddown plate 195. Rear panel 191 has a plurality of slots 199 therethrough, each aligned with a burn-in board connector of mother board 123, 125. Each slot 199 extends vertically from a point spaced above the top of the receptable of such burn-in board connectors to a point spaced below the lowermost bar 171 of bus bar units 127–133, i.e., bus bar unit 133.

Gasket 193 is juxtaposed to the front surface of rear panel 191 and completely covers all of slots 199. Gasket 193 includes a plurality of slits 201, each slit 201 aligned with one of slots 199 of rear panel 191 and extending substantially the entire length of such slot 199. Gasket 193 is made of a flexible material which will permit passage of a printed circuit board through a slit while maintaining a substantial air seal about such board.

Holddown plate 195 secures gasket 193 to rear panel 191 and includes a plurality of slots 203 therethrough, each slot 203 having a configuration substantially identical to that of slots 199 and aligned with one of slots 199 so as to expose a slit 201.

Burn-in Boards

Figure 10:
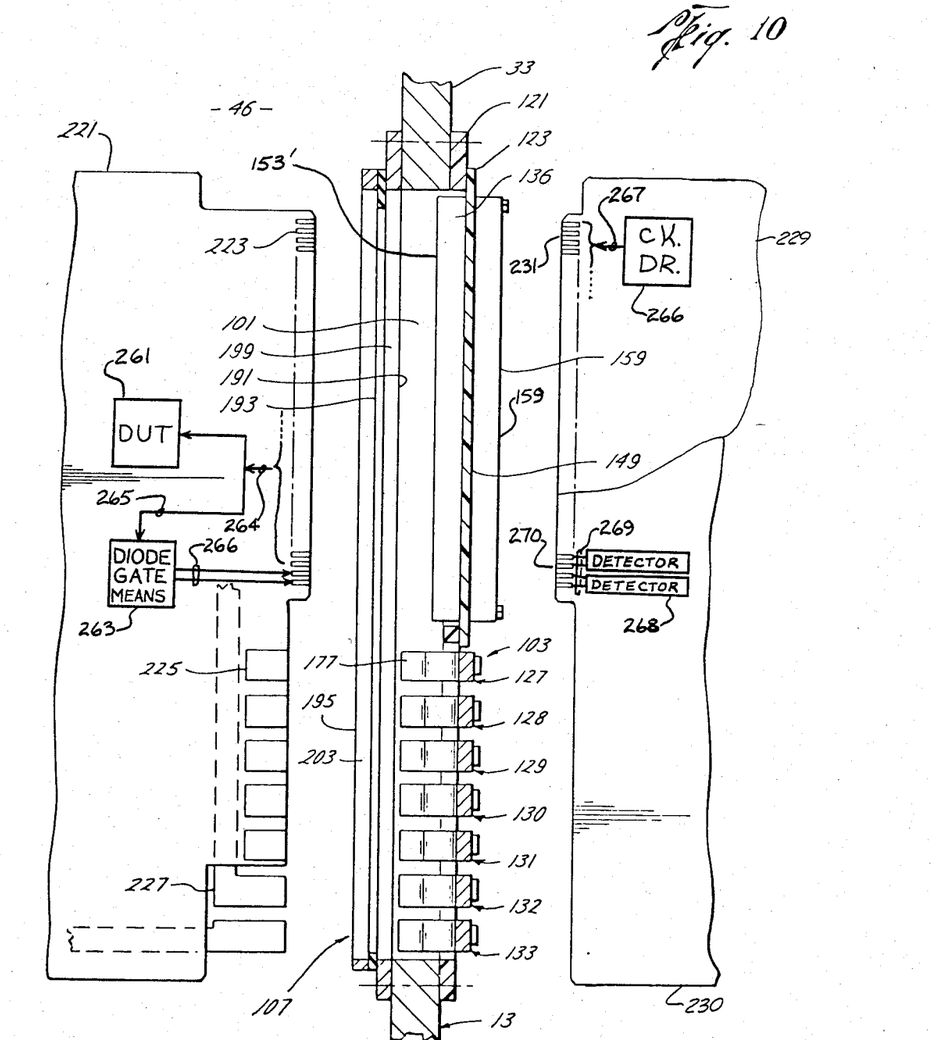
FIG. 10 is a fragmentary vertical sagittal section taken at plane 10—10 indicated in FIG. 5.
Figure 11:
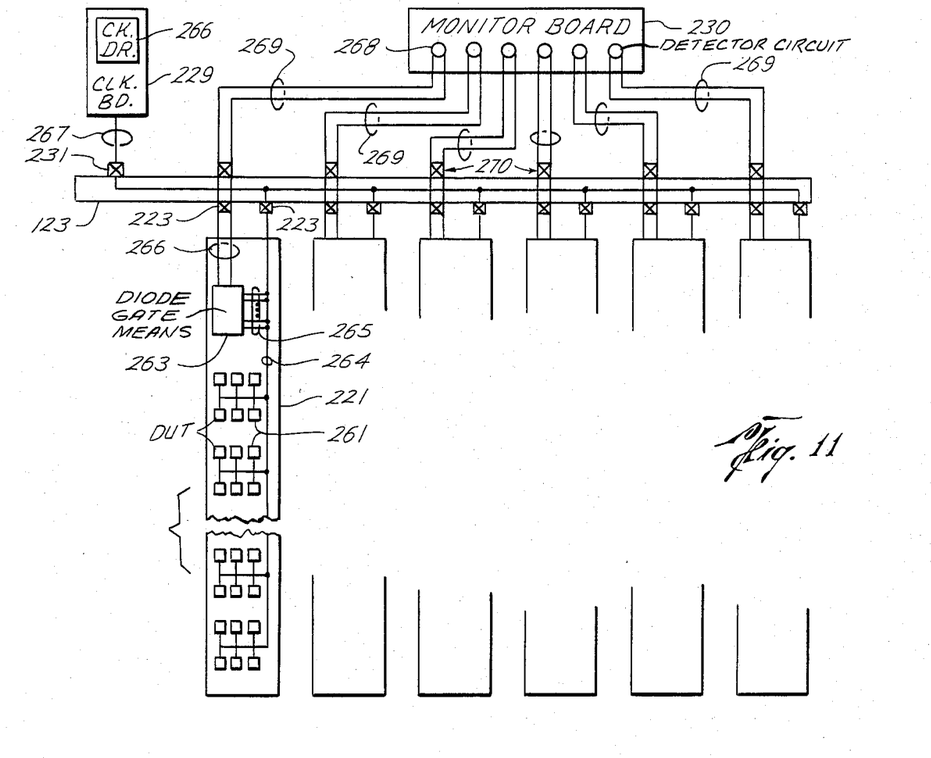
FIG. 11 is a schematic circuit diagram showing a combination of elements according to the invention for sending clock signals over multiple lines from a clock board outside a burn-in chamber to burn-in boards inside the chamber, double ANDing the clock signal lines on each of the burn-in boards to produce a pair of monitor lines for each burn-in board, and returning the monitor lines back outside the burn-in chamber to a monitor board.

Referring to FIG. 10, a burn-in board, e.g., 221, having edge connection lands 223 etched thereon for mating with a cardedge connector, power connection lands 225 etched thereon along the same edge as that containing lands 223, and power connection bars 227 disposed adjacent lands 225 can be mated with a burn-in board connector and with the clips extending through the power clip access opening directly below such burn-in board connector by inserting the edge of board 221 having lands 223, 225 and bars 227 through the slit of gasket 193 or gasket 209 aligned with such burn-in board connector until mating is securely accomplished. As a result, the edge of board 221 having lands 223, 225 and bars 227 will be generally disposed in cavity 101 and the remainder of board 221 will be disposed in chamber 11.

Figures 15, 16:
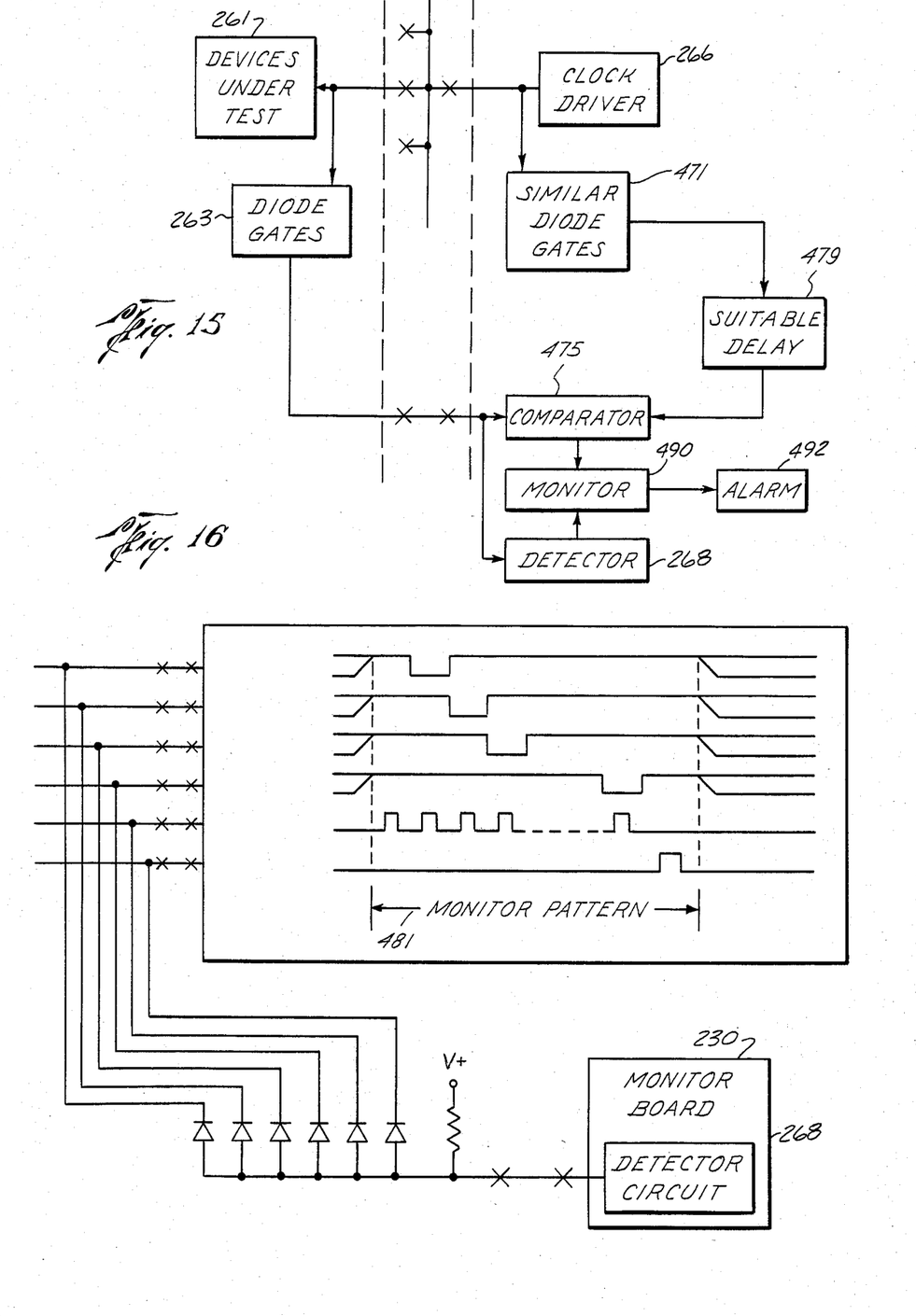
FIG. 15 is a view similar to FIG. 14 showing a modification for detecting failures in the diode gate circuitry.
FIG. 16 is a view similar to FIG. 12 showing a modification implementing one line monitoring with special monitoring signals included in the clock ouput as shown in the Figure.

Referring now primarily to FIG. 10 and also to FIG. 16, mounted on each burn-in board 221 are a plurality of devices under test 261 with their terminals connected by a printed circuit on the board to edge connections 223. Also mounted on each burn-in board is a diode gate means 263 for tapping each of the clock signal lines 264 fed to the devices under test via connections 223. Plural input lines 265 feed diode gate means 263, there being one input line for each clock signal line 264. One or two output lines 266, constituting monitor lines 1 and 2 (ML1, ML2 in FIG. 12), are fed back through the back wall of chamber 11 via one or two of edge connections 223.

Clock Boards and Monitor Boards

Similarly, each clock board 229 and monitor board 230 having edge connection lands 231 can be mated with a clock board or monitor board connector 159, 148 merely by inserting such board into such connector. When a clock board 229 or a monitor board 230 is securely mated in a clock board or monitor board connector of a particular mother board 123, 125, such clock board 229 or monitor board 230 will be connected by way of strips 163 to each burn-in board 221 inserted into one of the burn-in board connectors of such mother board.

There may be one clock board 229 for every five or ten burn-in boards, and of the order of five or ten clock boards 229 per burn-in chamber. Mounted on each clock board 229 is a clock-driver means 266 for generating a plurality of contemporaneous sequences of signals fed via a plurality of lines 267 to edge connection lands 231 for connection via printed circuitry on mother board 123 to burn-in board edge connections 223.

Mounted on each monitor board 230 are a plurality of detector circuit means 268 for producing audible or visual displays or otherwise alerting the user to the fact that correct clock signals may not be reaching a burn-in board, there being one detector means 268 for each burn-in board 221. Each detector means input comprises one or two monitoring lines (#1 and #2) 269 connected to edge connector means 270. Edge connector means 270, when plugged into the mother board 123, is connected by printed circuitry on the mother board to the diode gate means 263 on one of the burn-in boards via one or more of card edge connections 223.

Cool Connector Cavity

As set forth in the aforementioned Bradshaw application, the gasket of a cavity cover assembly will provide a seal against any substantial flow of air between chamber 11 and the cavity covered by such cavity cover assembly whether or not there are any burn-in boards inserted through any of the slits of such gasket. As a result, such gasket provides a thermal seal between chamber 10 and such cavity and the temperature within such cavity will be less than that within chamber 11. By providing a supply of gaseous nitrogen through the nozzles of a mother board of a connection device assembly, the temperature of the cavity adjacent such mother board will be maintained well below that of chamber 11. Furthermore, the atmosphere of the cavity adjacent such mother board will be largely inert due to the heavy concentration of nitrogen. As a result of such lower temperature and inert atmosphere, deterioration of the burn-in board connectors of such mother board is reduced well below the deterioration that would occur if such burn-in board connectors were located directly within chamber 11.

Rear Cabinet

Rear cabinet 34 covers the exterior surfaces of connection device assemblies 27, 29, 31 as well as the clock boards and monitor boards mated with the clock board and monitor board connectors of such assemblies. Preferably, rear cabinet 34 includes doors on its rear surface for permitting access to the clock boards and monitor boards as well as to the connection device assemblies, should repair or adjustment be necessary. Cabinet 34 may further include trays, such as that referenced as tray 255 (see FIG. 5), attached to the frame of chamber 10 and extending in a horizontal plane from the exterior surface of rear portion 33 of chamber wall 13 adjacent connection device assemblies 27, 29, 31, such trays being positioned so as to support the clock board and monitor board mated with the clock board and monitor board connectors of such connection device assemblies.

Instrumentation and Power Supply

Within instrumentation and power supply housing 12 of chamber 11, there is rack mounted equipment for controlling the environment within chamber 11 and for supplying and controlling the supply of electrical power to the clock board, the burn-in boards and the monitor boards.

The rack mounted equipment preferably includes an environmental control unit 300 having temperature controller 301 for controlling the supply of power to heater 24; temperature recorder 303 for recording the temperature within chamber 11 with respect to time; an oven temperature control microswitch activated by the temperature sensor of the recorder for shutting heater 24 off when the temperature in chamber 11 exceeds a predetermined level; an air flow switch for monitoring air flow within chamber 11 and shutting heater 24 off ("lockout") when air flow rate falls below a predetermined level; indicators 309 for indicating the status of the apparatus, e.g., standby (ready to begin a burn-in run), running (burn-in run in process) and lockout; control switches 311 for starting and stopping a run and for varying the speed of the impeller of air mover 26; and a power disconnect for breaking the supply of electrical power to the apparatus when current pull becomes excessive.

The rack mounted equipment further includes power supply unit 321 including power supplies 323 for supplying dc power to the burn-in boards and clock and monitor boards, preferably having the capability of supplying power at several different voltage levels. The outputs of power supplies 323 are connected to bars 171 of bus bar units 127–133, the actual voltage supplied to each bar varying in accordance with the configuration of the burn-in boards and clock boards and monitor being used. Power supply unit 321 may further include power supply sequence 325 for controlling the sequence and time that particular dc voltage levels are supplied by power supplies 323.

The supply of ac power to both environmental control unit 300 and power supply unit 321 may be controlled through a set of control relays.

Diode Gate Means—First Embodiment

Figure 12:
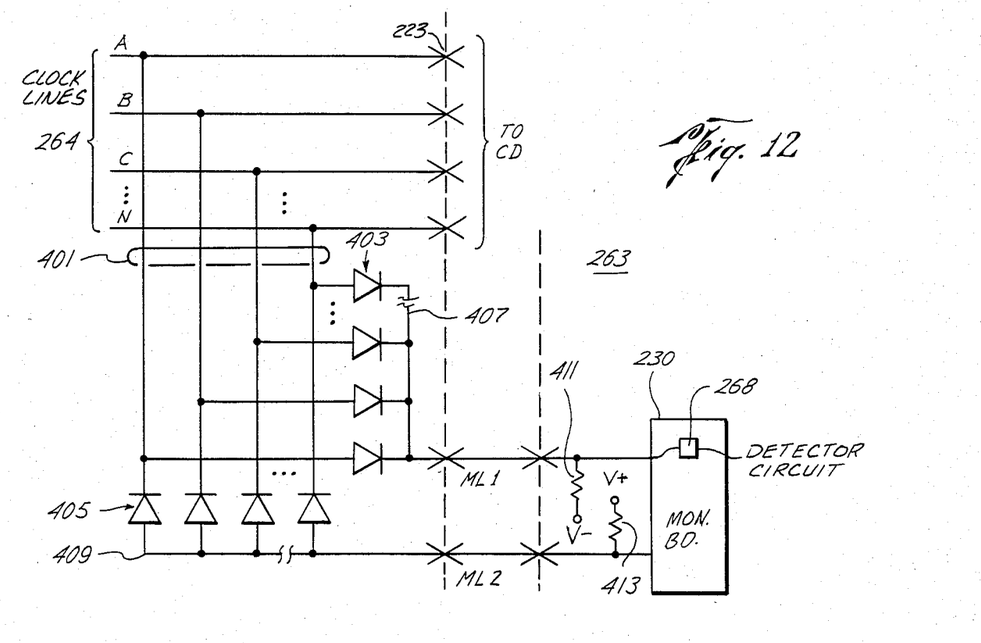
FIG. 12 is an enlarged fragmentary view of a portion of the diagram shown in FIG. 11.

Referring now to FIG. 12, there is shown a first embodiment of diode gate means 263 of FIGS. 10 and 16. Clock lines 264 are seen to comprise clock lines A, B, C, D, E, F, G, H, I, J, K, L and N, each of which is connected by one of parallel lines 401 to one of solid state (semiconductor) diodes 403, and to one of similar but reversed polarity diodes 405. The cathodes of diodes 403 are tied together by line 407 (monitor line #1) and the anodes of diodes 405 are tied together by line 409 (monitor line #2). Monitor lines #1 and #2 connect through mother board 123 in the back plane of chamber 10 via card-edge connectors 223 and 231 to detector circuits 268 on monitor board 230.

It will be apparent that diodes 403 constitute a negative logic AND gate (positive logic OR gate), and that diodes 405 constitute a positive logic AND gate. Thus, it may be said that the clock lines have been tapped by being ANDed together, once for monitor line #1 and once for monitor line #2.

Monitor lines #1 is also connected through a pull-up resistor 411 (e.g., 10K ohms) to a source of negative voltage (e.g., −5 v.). Monitor line #2 is also connected through a pull-up resistor 413 (e.g., 10K ohms) to a source of positive voltage (e.g., +8 v.).

Monitor line #1 will assume a low level only when all clock lines go to a low level. Furthermore, it will assume the highest low level of the several clock lines, less Vf (diode forward voltage drop). Similarly, monitor line #2 will assume the lowest high level plus Vf, only when all clock lines are high.

The foregoing leads to the first constraint on applicability of this embodiment of the invention. There must be some point during the clocking pattern generated by the clock-driver board when all lines are high and another point when all lines are low. However, nearly all patterns generated by commercial burn-in apparatuses have periods when all lines are high and periods when all lines are low.

A second constraint, necessary to insure that open clock lines are detected, requires that a circuit be arranged so that open lines assume a high or low state, rather than float between states. Many devices, such as TTL (transitor-to-transistor logic) devices, pull an open line high and thus require no additional circuitry. In this case, the failure of monitor line #1 to assume a low level would be detected. In the case of MOS devices, the addition of pull-up resistors to the clock lines on the burn-in board insures that an open line assumes a level high enough to cause a failure detection. The pull-up resistance should be smaller than the monitor line resistors 411, 413 but as large as possible to minimize load on the driver.

In view of the above considerations, the following constants are established:
1. All lines must be simultaneously high at some point during the clocking pattern and simultaneously low at some point in the clocking pattern.
2. An open line must assume a high or a low level rather than float therebetween.

Diodes are used to construct the two logic gates because of their more favorable characteristics in the harsh environment of a burn-in chamber. Ideally, the diode used should have as small a value of Vf as possible, minimal stored charge (hence very small reverse recovery time), and a Vf which is stable over a wide temperature range. These characteristics tend to improve the accuracy of the detection apparatus. Schottky diodes most closely meet these criteria. However, they are expensive and would add significant cost to the burn-in board, which has many clock lines. Although many diodes are adequate for this application, the 1N4448 computer switching diode works well.

Diode Gate Means–Second Embodiment

Burn-in chamber temperature is user selectable. The diode gate means of FIG. 12 will produce monitor line signal levels which vary with the selected burn-in chamber temperature according to temperature-induced variations in Vf.

Figure 13:
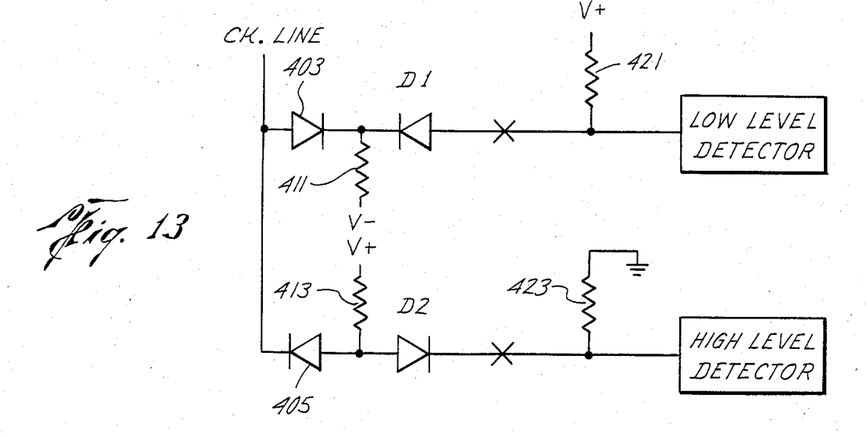
FIG. 13 is a view similar to FIG. 12 showing a modification for temperature compensation.

The schematic of FIG. 13 displays a circuit for overcoming the variation in Vf due to ambient temperature variation. By biasing the common bus for each monitor line and inserting D1 and D2, the levels on monitor line

Figure 18:
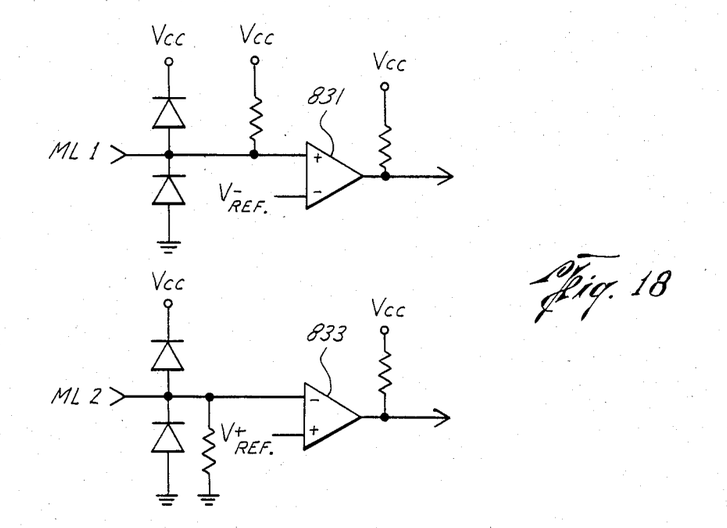
FIG. 18 is a schematic circuit diagram of a detector adjunct to be connected to the inputs of the FIG. 17, the modification being designed to respond only to monitor pulses longer than likely interference as per FIG. 14 and to be used with the temperature compensated diode gate line tap circuit of FIG. 13, providing a level sensitive detector circuit.

1 and monitor line #2 at the detector circuit will be very close to the levels on the clock lines. Now when all clock lines pull high, the common bus for monitor line #2 will be Vf higher than the lowest level on any of the clock lines, but monitor line #2 will be Vf lower than the common bus or approximately the same level as on the lowest clock line. This configuration limits voltage variations between clock lines and the monitor lines (Vf) to diode-to-diode variations in Vf, which have a standard deviation, at room temperature, of less than 20 mV and a range of less than 90 mV. Without D1 and D2, the diodes contribute as much as 200 mV of error due to temperature variations plus 90 mV of error due to Vf variations diode-to-diode. The magnitude of monitor line resistors 421, 423 should be chosen to equalize If (forward bias current) in the compensation diode (D1 or D2) and the gating diodes 411, 413 when the clock lines have assumed the detection states. With the voltage equilization circuit of FIG. 18, one may expect a monitor line voltage level within 50 millivolts of that of the lowest clock line with no appreciable deterioration of rise and fall times or ringing.

Third Embodiment

Figure 14:
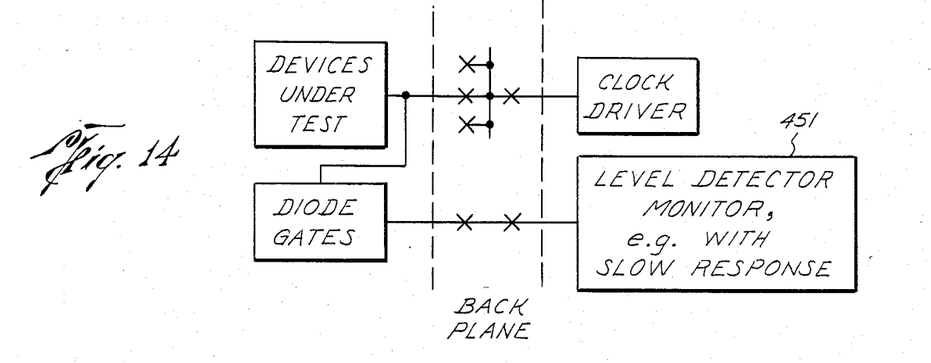
FIG. 14 is a schematic view showing a modification for overcoming the effects of overshoot and cross-talk.

FIG. 14 shows an apparatus designed to overcome effects of overshoot and crosstalk, enabling level detection monitoring to be effectively employed. A slow response time level detector 451 is utilized to achieve this result.

More overshoot and crosstalk have a duration of less than 100 nS. By limiting the response time of the level-detecting circuit to more than 100 nS, most of the effects of crosstalk and overshoot can be eliminated. A disadvantage of this construction is that some (very few) burn-in systems have minimum pulse widths of 100 nS and slower level detection would not work on these systems. However, with slower clock signals, e.g. high and low level pulse durations of 400 to 500 nS, level comparators which have slow response times can be used preventing any response to crosstalk or overshoot. The foregoing limitation, it may be noted, is applicable to any type of monitoring on the burn-in board, not just diode gate monitoring as discussed hereinabove.

Failure Modes

The following is an enumeration of the various types of failure that should be monitored and the results obtainable with the previously described embodiments:
1. Clock signal failure modes:
    A. Open line: With pull-up resistors (1K to 3K range) or with devices which pull up internally, one of the two monitor lines will stop toggling.
    B. Line shorted to another line: Not detectable.
    C. Line shorted to power supply or ground: One of the monitor lines will stop toggling.
2. Monitor component failure modes:
    A. Diode failure, open: Not detectable.
    B. Diode failure, shorted: Not detectable.
    C. Diode D1 or D2 (FIG. 18) open: One of the monitor lines will stop toggling.
    D. Diode D1 or D2 shorted: Not detectable.

Clock Signal Failure 1.B. is monitored with multiple line detectors presently in use by providing special circuitry on the clock boards. Compare FIG. 12 hereof.

Fourth Embodiment

Monitor Component Failure Modes 2.A. and 2.B. are detectable if, as shown in FIG. 15, similar diode and gate networks 471 are connected directly to the clock-driver outputs and the outputs are compared to the monitor lines. Such an arrangement could result in a race condition because of variable transmission delays along the two paths to the comparator 475. If minimum pulse durations are longer than the delays encountered in the longest transmission path, no problem results. If minimum pulse durations are shorter, a delay circuit 479 may be used to eliminate the race condition. Output signals from the detector circuit 268 and the comparator 475 are monitored, as at 490, to generate an alarm 492.

Fifth Embodiment

To eliminate the slow time response limitations of the circuit shown in FIG. 14, one solution is to periodically pull all signals low and then all high once during the pattern for a few hundred nanoseconds. If the clock pattern is interrupted periodically and a variable length monitor pattern sent over the clock lines, as shown in FIG. 16, all Failure Modes except 2.D. may be detected and only one of the monitor lines is needed.

If monitor line #2 (FIG. 18) is used, for example, the monitor pattern 481 pulls all lines high long enough for transients to settle and a voltage reading of the lowest high level line to be taken. Each line would then individually assume a low level so that a voltage reading could be taken. This method would eliminate one monitor line, the necessity for a negative bias, and would always detect all Failure Modes except 2.D. Failure Mode 2.D. would be detected in all cases except those unlikely times when the Vf of the gating diodes introduces sufficient voltage offset to screen the failure. Also, if properly implemented, the monitor pattern method would eliminate independent monitor circuitry presently used to verify proper operation of the clock itself.

Monitor Board Circuiry

Detector A

Each of the several diode gate means for tapping the burn-in board clock lines and producing a monitor signal calls for a complementary type of detector means on the monitor board.

Figure 17:
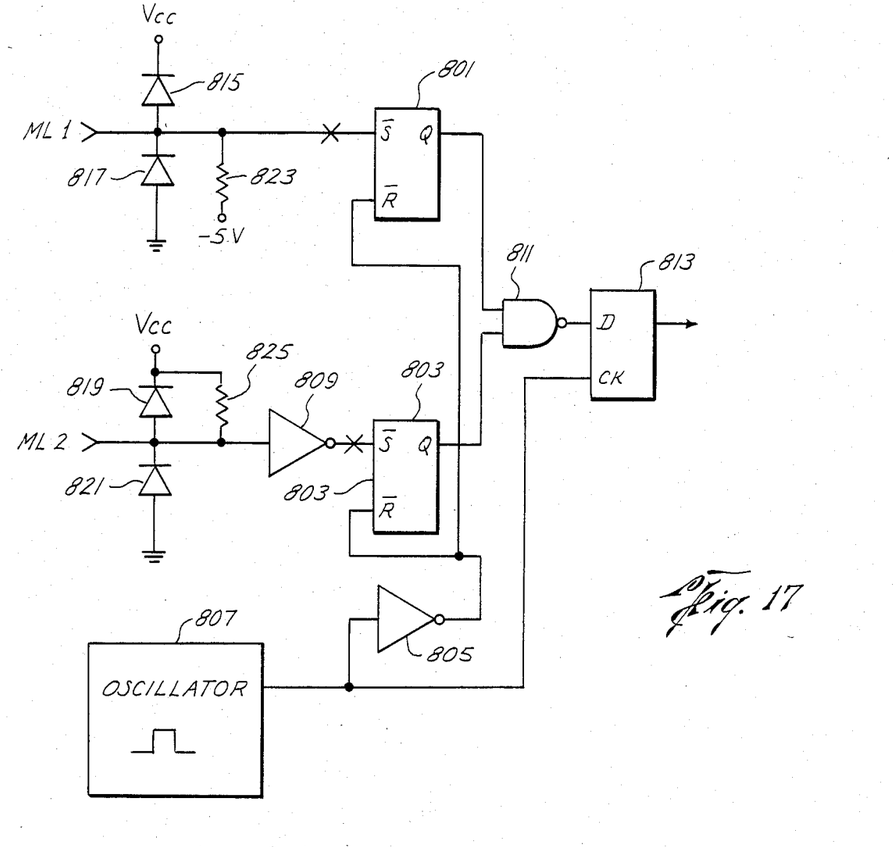
FIG. 17 is a schematic circuit diagram of a detector circuit to be used with the simple diode gate line tap circuit of FIG. 12, to detect monitor line toggling.

If the clock signal lines on the burn-in board are to be monitored only for toggling, i.e. for presence and absence of high and low voltage levels at appropriate intervals, the FIG. 12 burn-in board diode gate means with 1K ohm pull up resistors on each line (cf FIG. 13) may be connected to the monitor board detector means A shown in FIG. 17. As there shown, each of monitor lines #1 and #2 is fed to the $\overline{S}$ terminal of an LS 279 latch 801, 803 whose $\overline{R}$ terminal is connected, through a 7404 inverter 805, to an oscillator 807 whose period is greater than the clock pattern period. The connection of monitor line #2 to its latch 803 is through a 7404 inverter 809, because its signals are of opposite polarity from those of monitor line #1. The Q terminals of the latches 801, 803 are connected to a NAND gate 811. The NAND gate output and oscillator 807 are connected to D and Clock input terminals of a flip-flop 813. The Q output of the flip-flop 813 is connected to an alarm.

The monitor lines are stabilized by voltage clamping diodes 815, 817, 819, 821 and pull-up resistors 823, 925.

Detector B

The temperature compensated diode gate means of FIG. 13 reflects the level of clock-driver signals with an accuracy sufficient to enable detection of faulty clock signal levels. The FIG. 13 diode gate circuit may be added to each burn-in board with 1K ohm pull-up resistors. A detector circuit for the temperature compensated diode gate means of FIG. 13 may be constructed by connecting the electrical circuit shown in FIG. 18 to the monitor line inputs of the circuit shown in FIG. 17. It will be seen that this modification consists primarily of the addition of comparators 831, 833 in the monitor lines, the arrangement of comparator 833 eliminating the need for inverter 809 of FIG. 17. Detector B embodies the slow response detector circuit of FIG. 14.

Detector C

Figure 19:
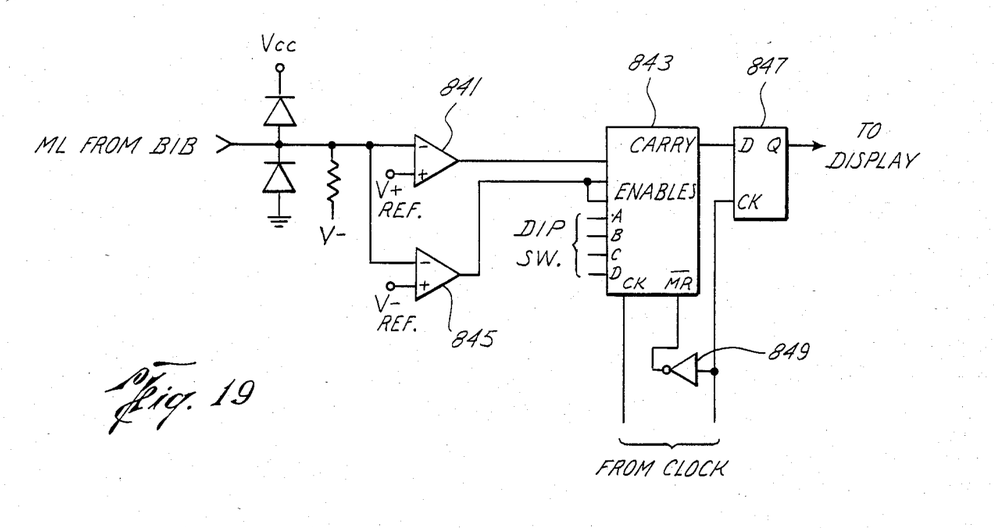
FIG. 19 is a schematic electric circuit diagram showing a modification of the FIG. 12 diode gate line tap circuit for the burn-in boards and of the FIG. 17 detector circuit, suitable for use with a clock-driver having a monitoring interval pattern as shown in FIG. 16.

If a special monitoring pattern is incorporated in the clock signal sequences, e.g. as shown in FIG. 16, a detector circuit as shown in FIG. 19 may be used. It should be recalled that in this embodiment of the invention only one monitor line is required.

As shown in FIG. 19, the monitor line from the burn-in board is connected to a first comparator 841, the output of which is connected to the load terminal of a counter 843. In parallel therewith the monitor line is connected to a second comparator 845, the output of which is connected to the enable terminal of the counter 843. The ABCD terminals of the counter are connected to DIP (dual in-line package) switches (not shown) set for the number of clock lines used. The switches are common to all of the detector circuits (one detector circuit per burn-in board). The counter carry terminal connects to the D input terminal of a flip-flop 847. The Q output terminal of the flip-flop 847 connects to a suitable display circuit.

The pulse gap width of the monitor pattern (PW in FIG. 16) depends on how fast the comparator can respond. If PW is about 1.5 microseconds, one can use inexpensive LM 339 quad comparators.

Detector C operates as follows: When all clock-driver lines are high and a strobe signal is present, counter 843 is loaded with a count equal to full count, less the number of clock lines monitored. When one (or more) clock-driver lines are low and a strobe is present, the counter advances the count. If the correct number of lows are counted, a carry signal will be transmitted to the flip-flop 847. If one or more of the clock-driver lines fails to generate a count on the counter 843, a carry signal will never be transmitted to the flip-flop 847. If monitor pattern generation is implemented properly, virtually every component from the clock master oscillator through the drivers, the backplane and the burn-in boards can be checked against any single failure and most multiple failures.

Conclusion

The objective of the invention is to put as much information from the clock lines on a burn-in board onto as few return lines as possible by diode ANDing the clock lines onto one or two return lines. If implemented properly, the Diode AND Gate Monitor has no disadvantages compared to other monitor schemes and has the advantage of requiring less than one-tenth the hardware.

While preferred embodiments of the invention have been shown and described, modification thereof can be made by one skilled in the art without departing from the spirit of the invention.

I claim:
1. Burn-in apparatus comprising
a burn-in chamber having a wall,
means including electric connectors on both an inside and outside of the wall for transmitting electricity through the wall,
burn-in boards releasably connected to one of said electrical connectors on the inside of the wall,
clock boards releasably connected to said connectors on the outside of the wall,
monitor boards releasably connected to one of said electrical connectors on the outside of the wall,
first diode gate means on the burn-in boards and in communication with said monitor boards, and
second diode gate means on the burn-in boards in parallel with said first diode gate means, said second diode gate means performing a logical function distinct from said first diode gate means,
said apparatus including means whereby said clock boards supply electric signals to devices on the burn-in boards to exercise same and said first and second diode gate means supply monitoring signals that are a function of the clock signals to detector means associated with said monitor boards.

2. Apparatus according to claim 1
including environmental control means to regulate ambient conditions relative to said devices and said diode gate means, said clock means and monitor means being outside said environmental control means.

3. Burn-in apparatus comprising
a burn-in chamber having a wall dividing an interior of the chamber from an exterior thereof,
burn-in boards disposed in said chamber each carrying a plurality of electrical components for burn-in and having a clock-driver input,
clock-driver boards disposed outside said chamber each carrying means to supply electric signals which periodically all go low and periodically all go high,
connector means in said wall electrically connecting each of said clock-driver boards to at least one of said burn-in boards,
a positive logic AND circuit having its respective inputs connected one to each of said clock-driver inputs of at least one of said burn-in boards,
a negative logic AND circuit having its respective inputs connected one to each of said clock-driver inputs,
and detection means electrically connected to outputs of the AND circuits.

4. Apparatus according to claim 3,
said AND circuits being disposed inside said chamber, said detection means being disposed outside said chamber, and second connector means extending through said wall electrically connecting said AND circuits and said detection means,
the first said connector means and said second means being quick-connectable and disconnectable.

5. Method of burning in semiconductor devices wherein repeated exercise signal sequences are generated on each of a plurality of clock lines and fed through a wall of a burn-in chamber to devices under test mounted in parallel on burn-in boards in the chamber comprising periodically interrupting the exercise signal sequences to each clock line and supplying each clock line simultaneously with a monitoring signal pattern, tapping the clock lines on the burn-in boards with diode AND gate means adapted to generate a succession of pulses, one for each line, when the clocks are functioning properly, conducting the AND gate means output through the chamber wall to a counter, counting the pulses, and producing a display if the count goes awry.

6. Burn-in board comprising a plurality of clock lines, a plurality of quick-connectable and disconnectable connector means connected to each of said clock lines and adapted for connection to a plurality of devices under test, diode AND gate means comprising first and second pluralities of diodes each having an anode and a cathode the cathode of each diode of said first plurality of diodes connected to one of said clock lines and to the anode of one of said second plurality of diodes, and a second plurality of quick-connectable and disconnectable connector means connected to the AND gate means output.

7. Burn-in board according to claim 6 including temperature compensating diode means in series with the AND gate means output, and resistor biasing means connected to the AND gate means output near the temperature compensating diode means.

8. Burn-in board according to claim 6 or 7 in which the AND gate means includes one positive logic AND gate means connected to each clock line and one negative logic AND gate means connected to each clock line.

9. Burn-in apparatus including a burn-in chamber, outside the chamber clock means to generate exercise signals on a plurality of lines transecting a wall of the burn-in chamber and adapted for connection to devices under test in the burn-in chamber, inside the chamber first AND gate means having its input connected to the exercise signal lines and its output lines transecting a wall of the burn-in chamber, outside the chamber second AND gate means similar to the first AND gate means and having its input connected to the exercise signal lines, and comparator means connected to an output of the first and second AND gate means whereby to monitor the exercise signal lines for presence of proper signals.

10. Burn-in board clock signal monitoring apparatus for a burn-in chamber apparatus, including diodes on the burn-in boards in the burn-in chamber ANDing the clock signal lines to produce an output and detection means outside the burn-in chamber connected to the diodes through a wall of the burn-in chamber, said detection means having a minimum response time exceeding in duration expected transients, such as overshoot, from the diode ANDing output.

* * * * *